United States Patent
Roitman et al.

(10) Patent No.: US 6,680,570 B2
(45) Date of Patent: Jan. 20, 2004

(54) POLYMER ORGANIC LIGHT EMITTING DEVICE WITH IMPROVED COLOR CONTROL

(75) Inventors: Daniel B. Roitman, Menlo Park, CA (US); Homer Antoniadis, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 197 days.

(21) Appl. No.: 09/814,381

(22) Filed: Mar. 21, 2001

(65) Prior Publication Data

US 2003/0057828 A1 Mar. 27, 2003

(51) Int. Cl.[7] ............................. H01J 1/62; H01J 63/04
(52) U.S. Cl. ..................... 313/506; 313/503; 313/498
(58) Field of Search .................. 313/491, 494, 313/311, 506, 461, 463, 504, 503, 509, 498; 428/917; 385/47, 131; 257/89, 98

(56) References Cited

U.S. PATENT DOCUMENTS

| | | | |
|---|---|---|---|
| 5,674,636 A | * | 10/1997 | Dodabalapur et al. ...... 428/690 |
| 5,780,174 A | * | 7/1998 | Tokito et al. ................ 428/690 |
| 6,111,356 A | * | 8/2000 | Roitman et al. ............ 313/506 |
| 6,278,236 B1 | * | 8/2001 | Madathil et al. ............ 313/504 |
| 6,392,341 B2 | * | 5/2002 | Jacobsen et al. ............ 313/506 |
| 6,451,459 B1 | * | 9/2002 | Tieke et al. ................. 428/690 |

* cited by examiner

Primary Examiner—Nimeshkumar D. Patel
Assistant Examiner—Jason Phinney

(57) ABSTRACT

An OLED for emitting light at a predetermined peak wavelength, $\lambda$. The OLED includes an anode layer, a cathode layer and an electroluminescent layer constructed from an organic light emitting compound that generates light, including light having a wavelength equal to $\lambda$, by the recombination of holes and electrons. The electroluminescent layer is electrically connected to the anode layer and the cathode layer and is located between the anode and cathode layers. The OLED includes a first reflector and a second reflector, displaced from one another. The anode layer or cathode layer can serve as one of the reflectors. A spacer layer constructed from a material that is transparent at $\lambda$ is included between the reflectors and has a thickness that is adjusted such that the optical path length between the first and second reflectors is equal to $N\lambda/2$, where N is a positive integer.

3 Claims, 3 Drawing Sheets

POLYMER ORGANIC LIGHT EMITTING DEVICE WITH IMPROVED COLOR CONTROL

FIELD OF THE INVENTION

The present invention relates to electroluminescent devices, and more particularly, to the fabrication of organic light emitting diodes having more predictable colors.

BACKGROUND OF THE INVENTION

Organic polymer-based electroluminescent devices (OLEDs) have the potential for providing inexpensive alternatives to alpha-numeric displays and x-y addressable displays. Typically, an OLED consists of a transparent substrate coated with a transparent conducting material, such as Indium Tin oxide (ITO), one to five organic layers and a cathode made by evaporation or sputtering a metal of low work function characteristics, such as Ca or Mg. The organic layers are chosen so as to provide charge injection and transport from both electrodes to the electroluminescent organic layer (EL) where charges recombine emitting light. Usually there are one or two organic hole transport layers (HTL) between the ITO and EL, as well as one or two electron injection and transporting layers (EL) between the cathode and the EL.

The output spectrum generated by such devices often differs significantly from that predicted from the chemical structure of the material used for the EL layer. When the device output spectrum differs from the design spectrum, the designer typically adjusts the composition of the EL material and tries again. This hit or miss approach substantially increases the design cost.

In full color pixelated displays, the designer must provide three colors of pixels, and hence, the problems of unpredictable color output are increased. In addition, the color pixels must provide similar light outputs for any given drive current.

Broadly, it is the object of the present invention to provide an improved OLED.

It is a further object of the present invention to provide an OLED that has a predictable color output.

These and other objects of the present invention will become apparent to those skilled in the art from the following detailed description of the invention and the accompanying drawings.

SUMMARY OF THE INVENTION

The present invention is an OLED for emitting light at a predetermined peak wavelength, $\lambda$. The OLED includes an anode layer, a cathode layer and an electroluminescent layer constructed from an organic light emitting compound that generates light, including light having a wavelength in a band around $\lambda$, by the recombination of holes and electrons. The electroluminescent layer is electrically connected to the anode and the cathode layers and is located between the anode and cathode layers. The OLED includes first and second reflectors, displaced from one another. The anode or cathode layers can serve as one of the reflectors. A spacer layer constructed from a material that is transparent at $\lambda$ is included between the reflectors and has a thickness that is adjusted such that the optical path length between the first and second reflectors is equal to N $\lambda/2$, where N is a positive integer. The spacer layer may include a hole transport material located between the electroluminescent layer and the anode. The spacer layer may also be constructed from a layer that is located between the anode or cathode layers and one of the reflectors. If the spacer layer is located between the anode and cathode layers, the spacer layer is constructed from an electrically conducting material.

DETAILED DESCRIPTION OF THE INVENTION

Figure 1:
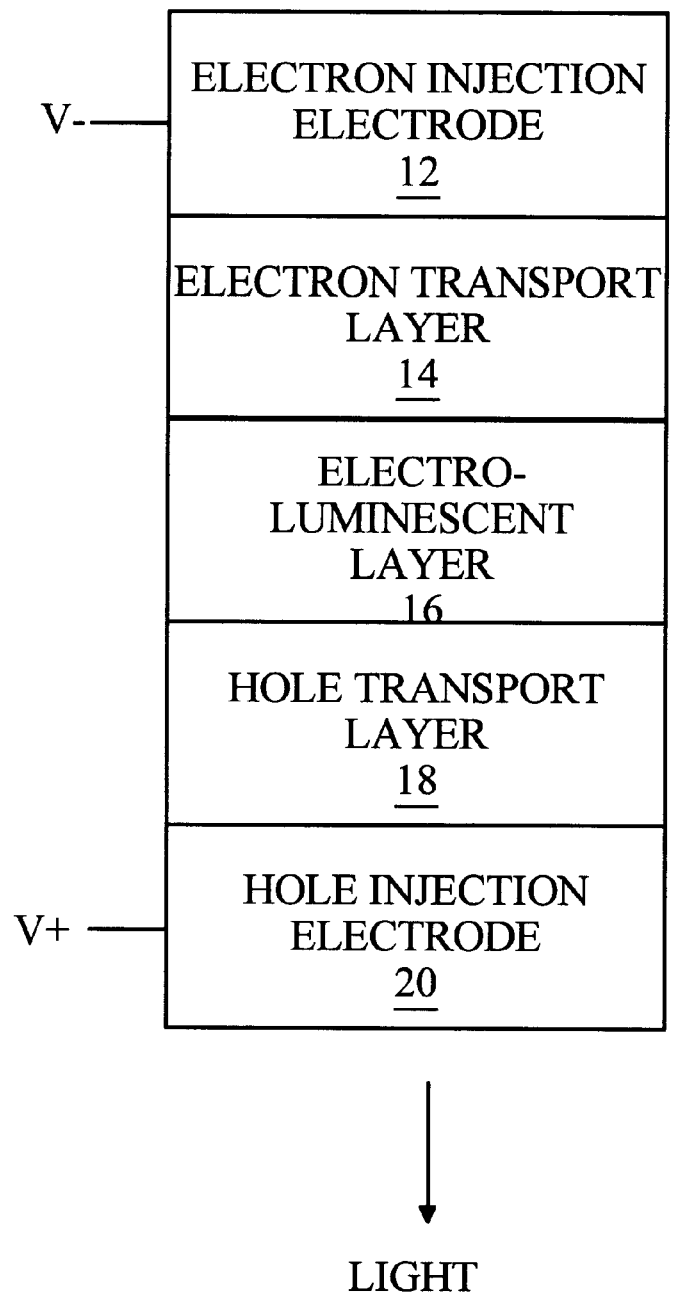
FIG. 1 is a cross-sectional view of an OLED.

The present invention may be more easily understood with reference to FIG. 1, which is a cross sectional view of an OLED. The OLED includes an electron injection electrode 12 (the cathode), an electron transport layer 14, an electroluminescent layer 16, a hole transport layer 18, and finally a hole injection electrode 20. The electron transport and hole transport layers are usually designed to facilitate charge transport and assist charge balance to optimize charge recombination in the electroluminescent layer. The anode is typically a transparent electrode, such as a layer of indium tin-oxide on top of a transparent support (glass or plastic). The cathode is typically a vapor deposited metal, preferably with a work-function closely matching the energy level of the electron transport layer. It should be noted that the electron transport and hole transport layers are optional. The most commonly used polymeric materials for the electroluminescent layer are derivatives of p-phenylene vinylene such as Poly(2-dicholestanoxy-p-pbenylene-vinylene) (BCHA-PPV) and paly (2-methoxy-5-(2'-ethyl-hexoxy)-1, 4-phenylene vinylene) (MEHPPV).

The present invention is based on the observation that the two electrodes form the mirrored ends of an optical cavity that distorts the output spectrum of the EL layer. Even when a transparent electrode such as ITO is utilized, the difference in index of refraction between the hole injection layer material and the anode, or between the transparent substrate and the surrounding air, results in the anode reflecting a significant fraction of the light striking the anode back toward the cathode. The cathode is typically a metal, and hence, reflects light striking it back toward the anode. While only a few reflections are present due to absorption of the light by the EL layer, there are sufficient reflections to provide constructive interference at wavelengths, $\lambda$, such that $$N\lambda = 2D, \tag{1}$$

where D is the optical path length between the reflecting surfaces. If the output spectrum of the EL layer includes wavelengths that satisfy Eq. (1), that portion of the spectrum will be accentuated, and the resulting spectrum will differ significantly from that predicted from the chemical composition of the EL layer.

The present invention makes use of this constructive interference to tune the output spectrum of the OLED. To provide an OLED with an output spectrum that is peaked at $\lambda$, an EL material having a broad output spectrum with a significant output at $\lambda$ is chosen, and distance between the reflecting ends of the cavity is chosen to satisfy Eq. (1). In general, this will require that the ends of the cavity be moved further apart relative to the distance between the electrodes normally utilized in OLEDs.

In addition, the number of reflections is increased by placing a reflecting coating or other form of mirror under the anode when a transparent anode such as ITO is utilized. The reflecting coating, or the cathode, is chosen such that part of the light generated in the device can still exit through the coating or cathode.

In one embodiment of the present invention, the distance between the reflecting ends is adjusted by adjusting the thickness of one or more of the layers. In this regard, it should be noted that the layer chosen must have two properties. First, the material must be highly conductive compared to the other layers. In general, the thickness of the layer in question will be much greater than that of the EL layer. If the layer has a resistance that is comparable to that of the EL layer, the voltage drop across this layer will increase the voltage required to operate the device. In addition, the power loss across the layer will be substantial, and hence, the overall device efficiency will be low. In general, the resistivity of the EL layer is too great to allow the EL layer to be used for adjusting the optical path length.

Second, the material in the layer that is chosen must be transparent at the desired wavelength. In general, the EL layer is not highly transparent. Hence, the chosen layer must be much more transparent than the EL layer to assure that the additional material does not result in a loss of efficiency due to light absorption.

In this preferred embodiment of the present invention, the hole transport layer (HTL) is chosen as the adjustment layer. For example, the HTL layer may be constructed from poly(3,4-ethylenedioxythiophene) (PEDOT). PEDOT has sufficient transparency and has a resistivity that is much less than that of the compounds typically utilized for the EL layer. If a more transparent layer is needed, the PEDOT may be mixed with more transparent particles as described below to provide a layer with a higher transparency.

Figure 2:
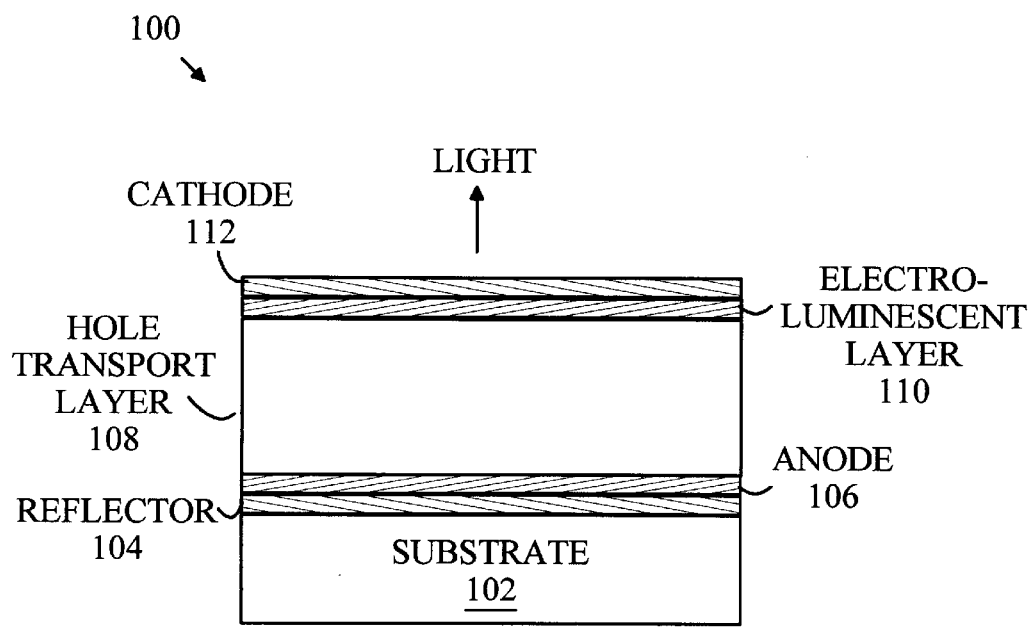
FIG. 2 is a cross-section of an OLED 100 according to the present invention.

Refer now to FIG. 2, which is a cross-section of an OLED 100 according to the present invention. OLED 100 is constructed on a substrate 102, which has a layer 104 of aluminum deposited thereon. The aluminum layer provides one of the mirrors that define the optical cavity. A transparent anode 106 is deposited on the aluminum mirror. The anode is preferably ITO. The HTL 108 is then deposited on the anode. The HTL is preferably constructed from a layer of PEDOT. Next, the EL layer 110 is deposited over the HTL 108. Finally, a semi-transparent cathode 112 is deposited over the EL layer. The cathode layer is preferably constructed from a thin layer of Ca covered with a thin layer of gold. The thickness of the HTL is chosen such that the optical path length between the anode and cathode satisfies Eq. (1) with λ equal to the desired output wavelength for the OLED.

Figure 3:
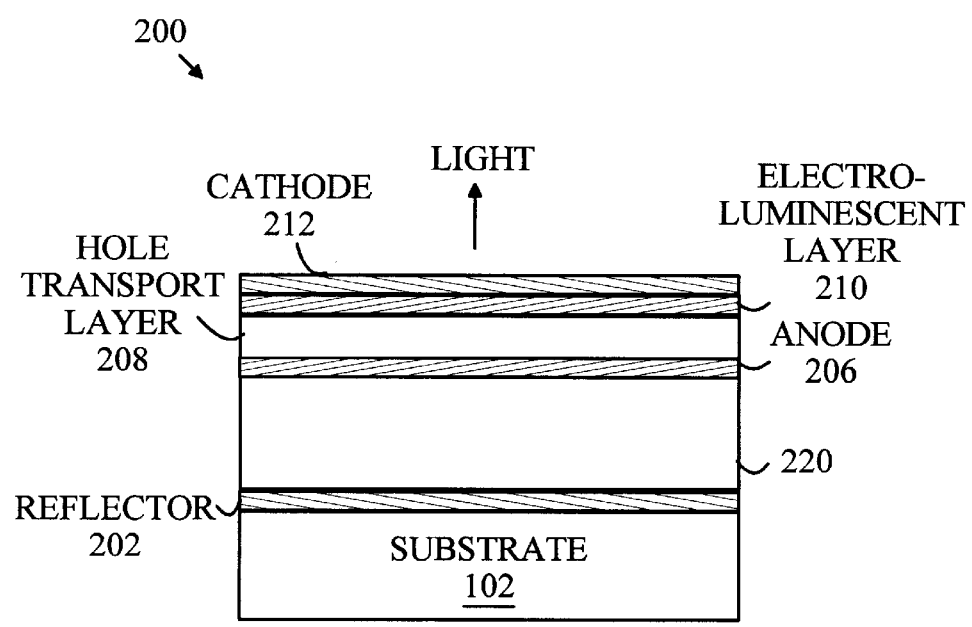
FIG. 3 is a cross-sectional view of an OLED 200 according to another preferred embodiment of the present invention.

It should be noted that the spacer layer need not be located between the anode and cathode. Refer now to FIG. 3, which is a cross-sectional view of an OLED 200 according to another preferred embodiment of the present invention. OLED 200 is similar to OLED 100 discussed above in that it is constructed from a transparent anode 206 which is preferably a layer of indium tin oxide (ITO). A HTL 208, EL layer 210, and cathode 12 are deposited in that order on anode 206. OLED 200 differs from OLED 100 in that anode 206 is deposited on a transparent spacer layer 220 such as $SiO_2$ which is deposited on a reflecting layer 202 that acts as the end mirror that defines the optical cavity together with cathode 212. Reflecting layer 202 may be a metallic layer or a mirror constructed from layers having different indices of refraction. Such mirrors are well known in laser arts, and hence, will not be discussed in detail here. In either case, the distance between the top reflecting electrode and mirror reflecting layer 202 is set such that the optical path length between these two reflecting surfaces is an integer multiple of $\lambda/2$. In this case, the spacer layer need not be constructed from an electrically conducting material.

Figure 4:
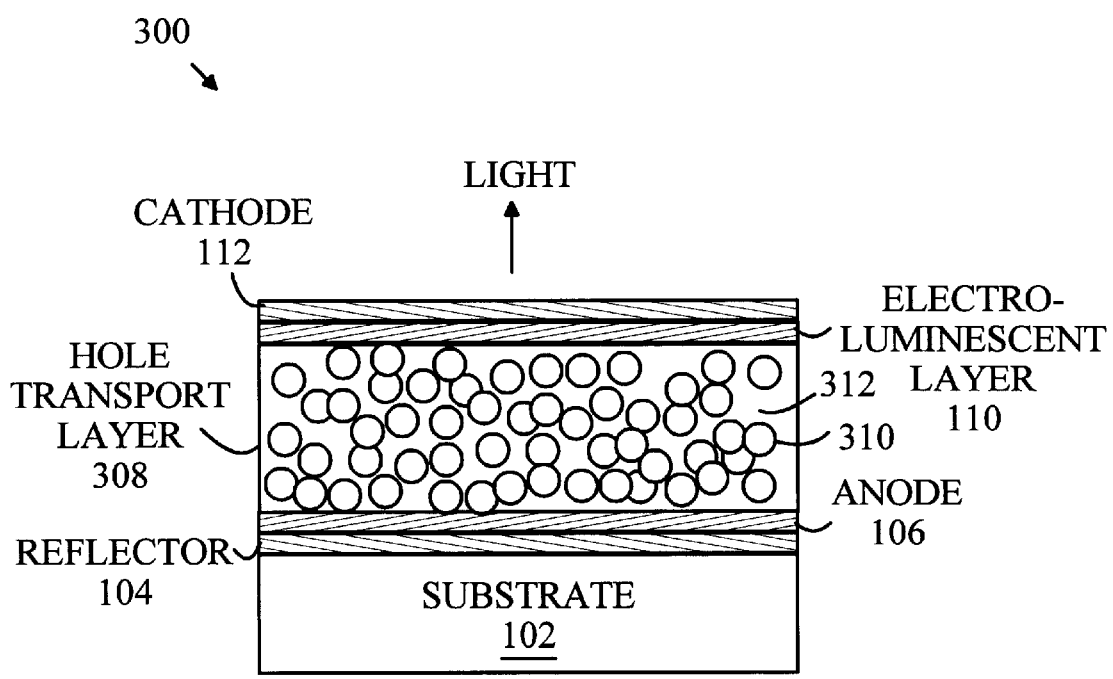
FIG. 4 is a cross-sectional view of yet another embodiment of an OLED according to the present invention.

It should also be noted that the spacer layer may be constructed from a mixture of components to provide increased clarity. Refer now to FIG. 4, which is a cross-sectional view of another embodiment of an OLED according to the present invention. OLED 300 is similar to OLED 100 shown in FIG. 2. To simplify the following discussion, those elements that serve the same function in OLED 300 as elements in OLED 100 have been given the same numeric designations. In OLED 300, the HTL layer 308 acts as the spacing layer. Spacer layer 308 can be constructed from a mixture of glass beads 310 and PEDOT. The PEDOT fills the area 312 between the beads, and hence, provides the necessary conductivity. The PEDOT provides a close enough match to the index of refraction of the beads to assure that the layer appears to be a single layer with transmission characteristics near those of glass. Since the transparency of the glass beads is much greater than that of the PEDOT, the resulting layer has a transparency that is substantially greater than that of a layer of the same thickness constructed from PEDOT.

Various modifications to the present invention will become apparent to those skilled in the art from the foregoing description and accompanying drawings. Accordingly, the present invention is to be limited solely by the scope of the following claims.

What is claimed is:

1. An OLED for emitting light at a predetermined wavelength, λ, said OLED comprising:

an anode layer;

a cathode layer;

an electroluminescent layer comprising an organic light emitting compound for generating light including light of said predetermined wavelength by the recombination of holes and electrons, said electroluminescent layer being electrically connected to said anode and said cathode and being located between said anode and cathode; and a first reflector;

a second reflector, said second reflector being partially reflecting and being displaced from said first reflector, such that the optical path length between said first and second reflectors is D;

a spacer layer comprising a material that is transparent at λ, wherein D=N λ/2, N being a positive integer, wherein said spacer layer comprises a hole transport material located between said electroluminescent layer and said anode layer, and wherein said spacer layer further comprises transparent particles mixed with said hole transport material.

2. An OLED for emitting light at a predetermined wavelength, λ, said OLED comprising:

an anode layer;

a cathode layer;

an electroluminescent layer comprising an organic light emitting compound for generating light including light of said predetermined wavelength by the recombination of holes and electrons, said electroluminescent layer being electrically connected to said anode and said cathode and being located between said anode and cathode; and a first reflector;

a second reflector, said second reflector being partially reflecting and being displaced from said first reflector, such that the optical path length between said first and second reflectors is D;

a spacer layer comprising a material that is transparent at $\lambda$, wherein $D=N\lambda/2$, N being a positive integer, wherein said electroluminescent layer lies between said anode layer and said cathode, wherein said cathode layer lies between said electroluminescent layer and said first reflector, and wherein said spacer layer lies between said cathode layer and said first reflector.

3. An OLED for emitting light at a predetermined wavelength, $\lambda$, said OLED comprising:

an anode layer;

a cathode layer;

an electroluminescent layer comprising an organic light emitting compound for generating light including light of said predetermined wavelength by the recombination of holes and electrons, said electroluminescent layer being electrically connected to said anode and said cathode and being located between said anode and cathode; and a first reflector;

a second reflector, said second reflector being partially reflecting and being displaced from said first reflector, such that the optical path length between said first and second reflectors is D;

a spacer layer comprising a material that is transparent at $\lambda$, wherein $D=N\lambda/2$, N being a positive integer, wherein said electroluminescent layer lies between said anode layer and said cathode, and wherein said anode layer lies between said electroluminescent layer and said second reflector, and wherein said spacer layer lies between said anode layer and said second reflector.

* * * * *